US010755897B2

(12) United States Patent
Ikeda et al.

(10) Patent No.: US 10,755,897 B2
(45) Date of Patent: Aug. 25, 2020

(54) PLASMA PROCESSING APPARATUS AND PLASMA PROCESSING METHOD

(71) Applicant: HITACHI HIGH-TECH CORPORATION, Minato-Ku, Tokyo (JP)

(72) Inventors: Norihiko Ikeda, Tokyo (JP); Kazuya Yamada, Tokyo (JP); Naoki Yasui, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/118,696

(22) Filed: Aug. 31, 2018

(65) Prior Publication Data

US 2019/0237300 A1    Aug. 1, 2019

(30) Foreign Application Priority Data

Jan. 30, 2018    (JP) .................................. 2018-013766

(51) Int. Cl.
   *H01J 37/32*    (2006.01)
   *H01L 21/3065*  (2006.01)
   *H01L 21/311*   (2006.01)

(52) U.S. Cl.
   CPC .. *H01J 37/32183* (2013.01); *H01J 37/32192* (2013.01); *H01J 37/32532* (2013.01);
   (Continued)

(58) Field of Classification Search
   CPC .......... H01J 37/32183; H01J 37/32532; H01J 37/32192; H01J 2237/334; H01L 21/3065; H01L 21/31116
   (Continued)

(56) References Cited

U.S. PATENT DOCUMENTS 6,930,047 B2 *   8/2005   Yamazaki ............... C03C 15/00
                                                    438/706
8,404,590 B2     3/2013   Lee et al.
(Continued)

FOREIGN PATENT DOCUMENTS

JP    2004-022822 A    1/2004
JP    2007-067037 A    3/2007
(Continued)

OTHER PUBLICATIONS

Taiwanese Office Action dated Apr. 11, 2019 for TW Application No. 107127335.

(Continued)

*Primary Examiner* — Lan Vinh
(74) *Attorney, Agent, or Firm* — Miles & Stockbridge, P.C.

(57) ABSTRACT

In a plasma processing apparatus, a placement electrode includes an inner peripheral electrode for electrostatically adsorbing a wafer and an outer peripheral electrode disposed outside the inner peripheral electrode for electrostatically adsorbing the wafer, and a DC power supply unit on which the wafer is placed supplies a first radio frequency power to the inner peripheral electrode via an inner peripheral transmission path. A DC power supply unit supplies a second radio frequency power having the same frequency as the frequency of the first radio frequency power to the outer peripheral electrode via an outer peripheral transmission path. An electromagnetic wave generating power supply supplies a third radio frequency power for generating plasma. A control device controls a phase difference between a phase of the first radio frequency power and a phase of the second radio frequency power so that a phase of a radio frequency voltage applied to the inner peripheral electrode
(Continued)

and a phase of a radio frequency voltage applied to the outer peripheral electrode are equal.

4 Claims, 16 Drawing Sheets

(52) U.S. Cl.
CPC .... *H01L 21/3065* (2013.01); *H01L 21/31116* (2013.01); *H01J 2237/334* (2013.01)

(58) Field of Classification Search
USPC ............ 438/706, 710, 714, 719; 156/345.44, 156/345.45, 345.47, 345.48; 216/67
See application file for complete search history.

(56) References Cited

U.S. PATENT DOCUMENTS

| | | | |
|---|---|---|---|
| 10,090,162 B2 | 10/2018 | Tanaka et al. | |
| 10,217,611 B2 | 2/2019 | Aramaki et al. | |
| 10,381,198 B2 | 8/2019 | Ui et al. | |
| 2005/0130620 A1 | 6/2005 | Fischer | |
| 2007/0235412 A1 | 10/2007 | Fischer | |
| 2010/0258529 A1 | 10/2010 | Mori et al. | |
| 2014/0083977 A1 | 3/2014 | Ui et al. | |
| 2017/0169996 A1 | 6/2017 | Ui et al. | |
| 2017/0186589 A1* | 6/2017 | Sato | C23C 16/50 |
| 2018/0068834 A1* | 3/2018 | Valcore, Jr. | H01J 37/32183 |
| 2018/0366335 A1 | 12/2018 | Tanaka et al. | |
| 2019/0122864 A1 | 4/2019 | Aramaki et al. | |

FOREIGN PATENT DOCUMENTS

| | | |
|---|---|---|
| KR | 20060127044 A | 12/2006 |
| KR | 20140040640 A | 4/2014 |
| KR | 20170101251 A | 9/2017 |
| TW | 200948217 A | 11/2009 |
| TW | 2010015637 A | 4/2010 |
| TW | 201220388 A | 5/2012 |
| TW | 201417137 A | 5/2014 |
| TW | 201642303 A | 12/2016 |

OTHER PUBLICATIONS

Korean Office Action dated Jul. 21, 2019 in counterpart Korean Application 10-2018-0083776.

* cited by examiner

FIG. 5
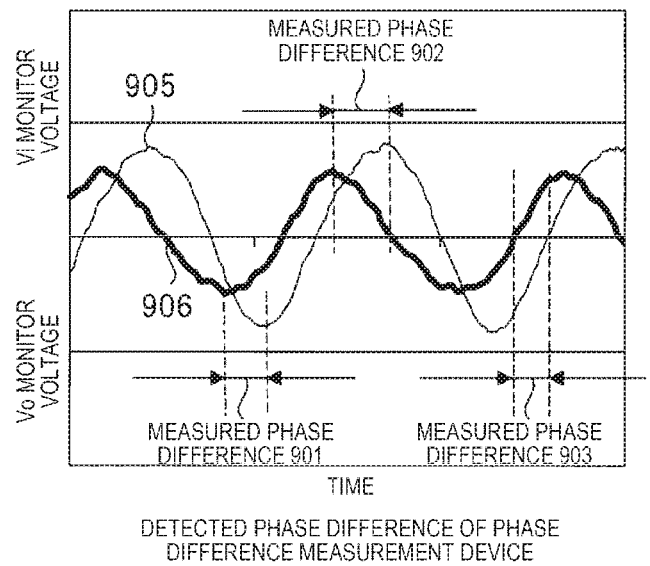
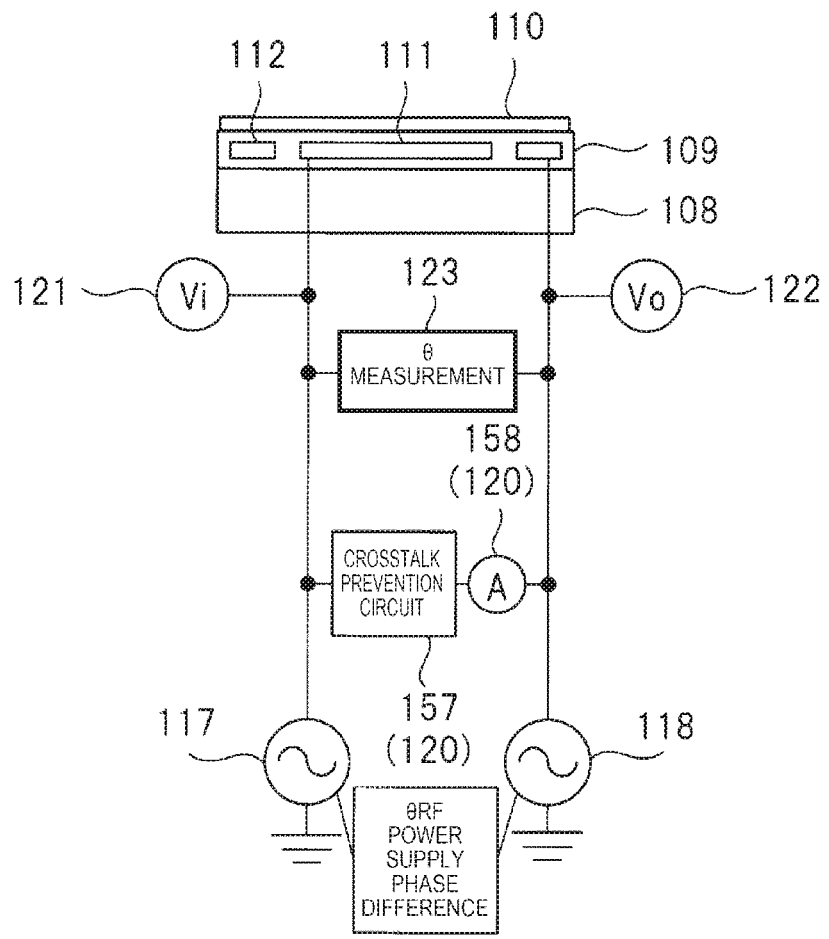

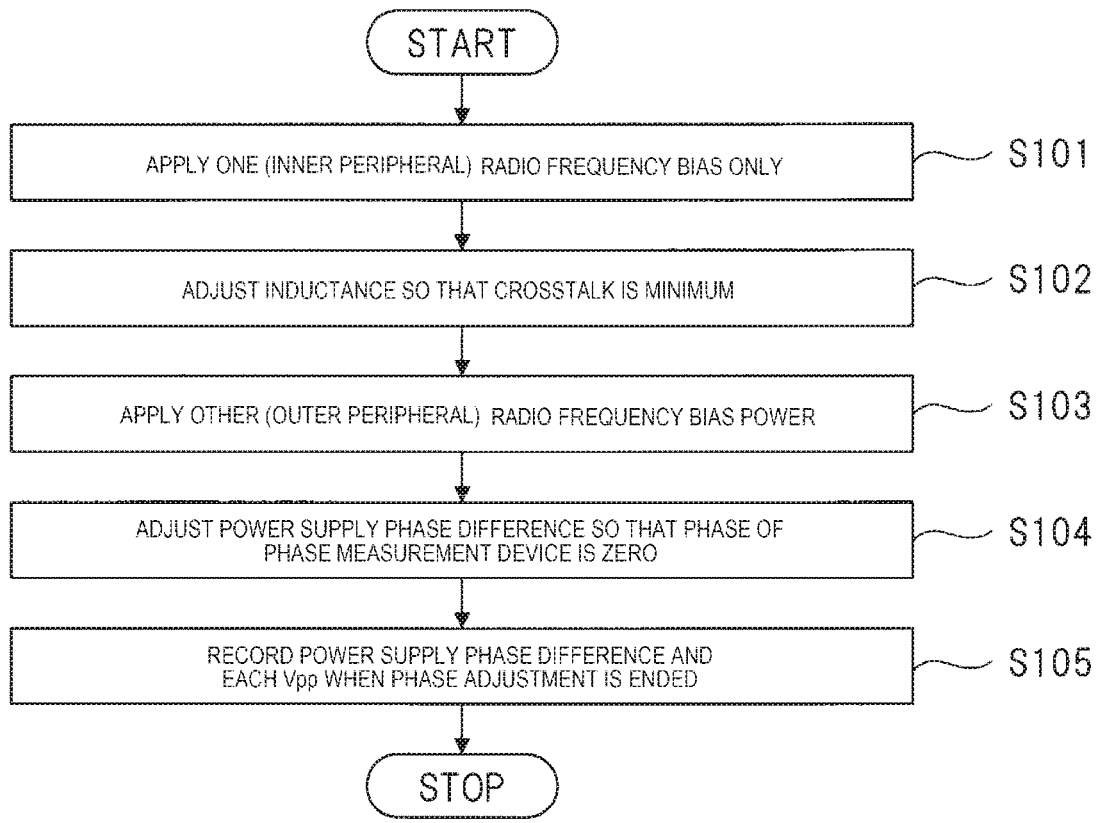

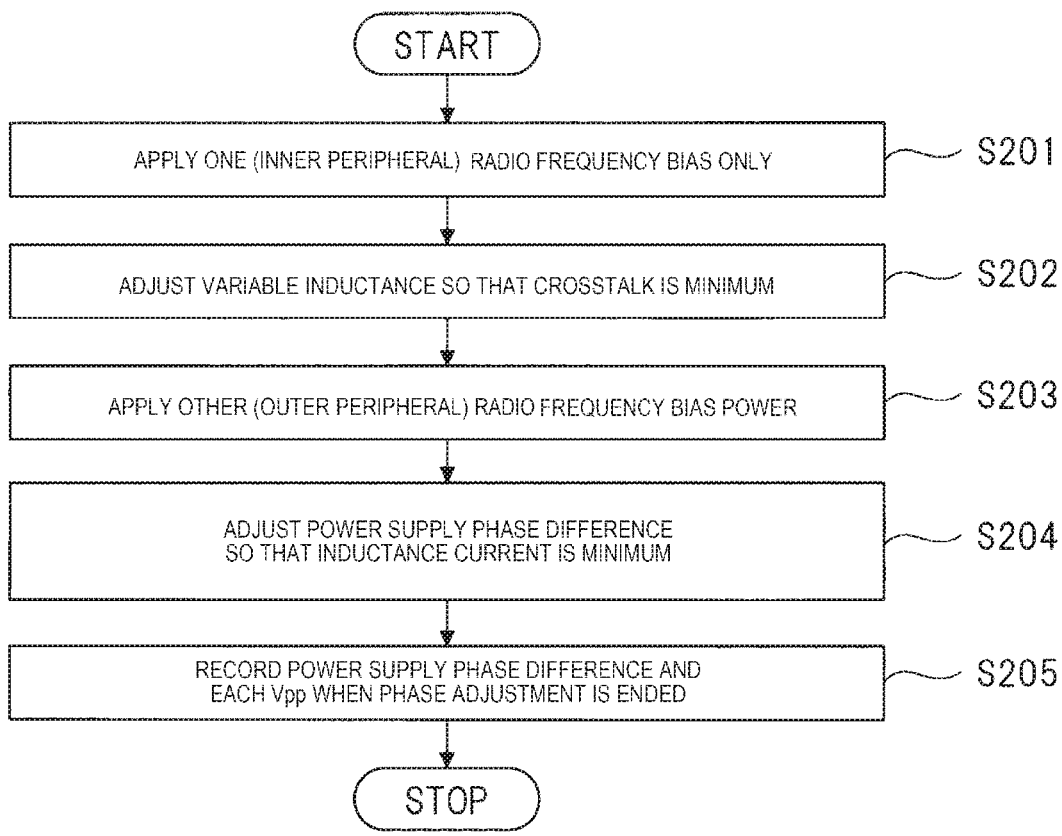

FIG. 13A

| POWER SUPPLY (OSCILLATION) PHASE DIFFERENCE | PLUS MEANS RADIO FREQUENCY BIAS OF INNER PERIPHERAL PORTION IS EARLY/ MINUS MEANS RADIO FREQUENCY BIAS OF OUTER PERIPHERAL PORTION IS EARLY | | |
|---|---|---|---|
| $\theta RF$ | -10 DEGREE | 0 DEGREE (IN PHASE) | +10 DEGREE |
| INNER PERIPHERAL PORTION VPP (Vi) | 230V | 200V | 170V |
| OUTER PERIPHERAL PORTION VPP (Vo) | 170V | 200V | 230V |
| INNER PERIPHERAL ETCHING RATE | 225nm/min | 200nm/min | 175nm/min |
| OUTER PERIPHERAL ETCHING RATE | 170nm/min | 198nm/min | 220nm/min |

FIG. 13B

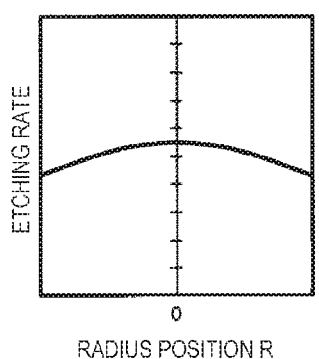 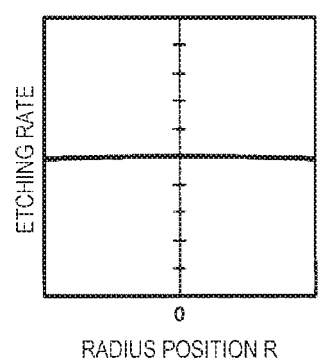 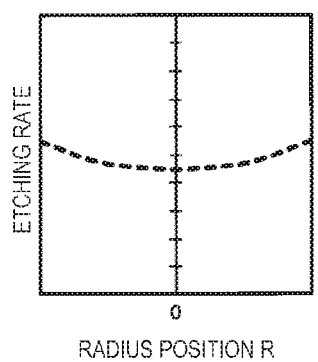

FIG. 14
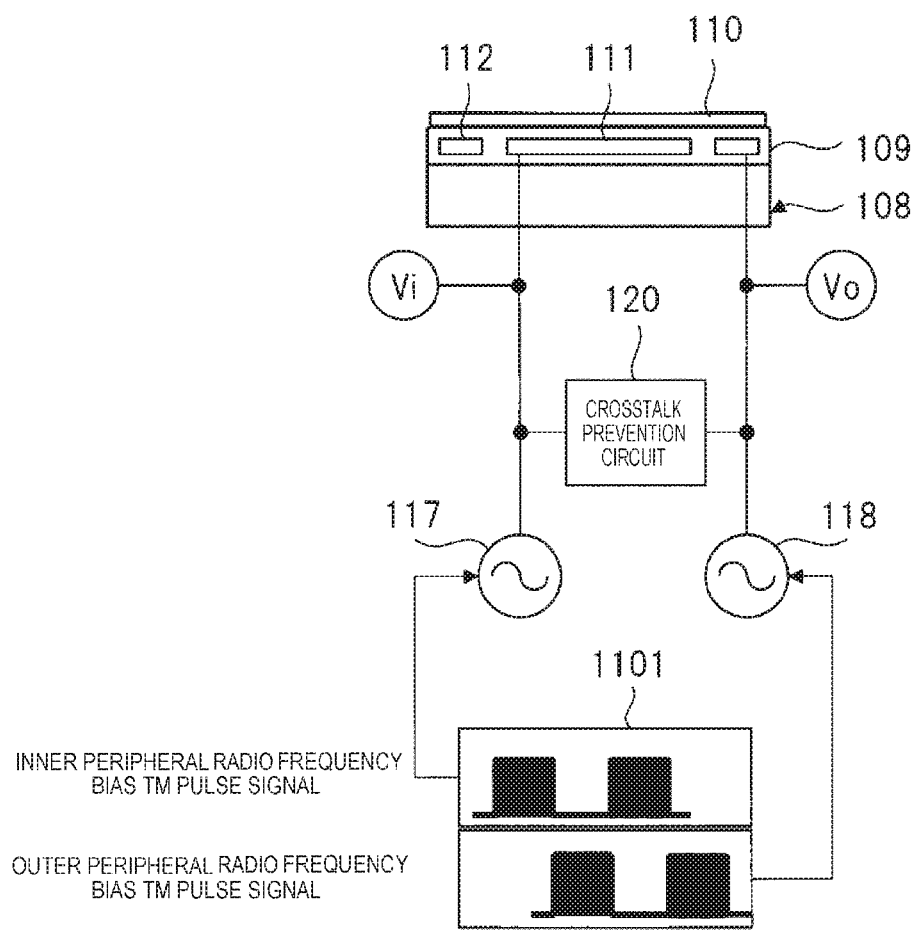
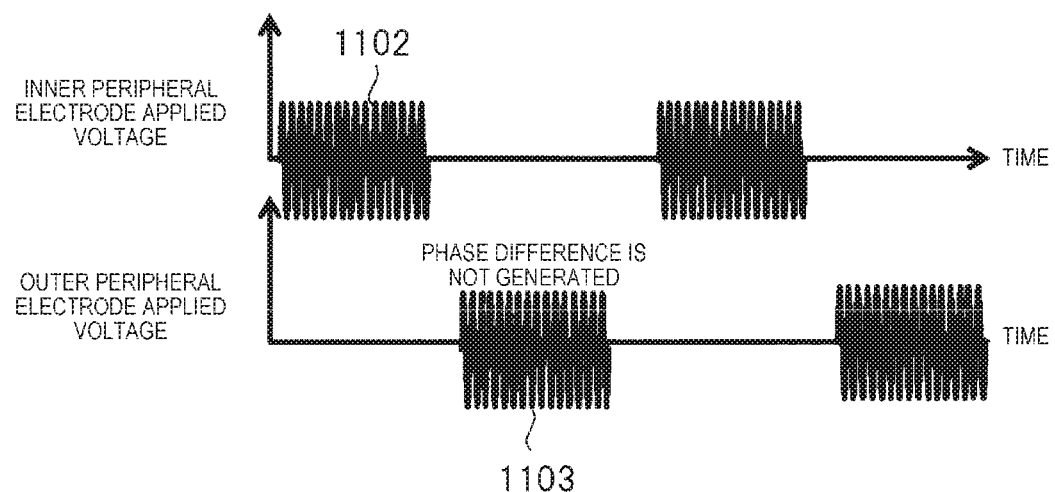

FIG. 15
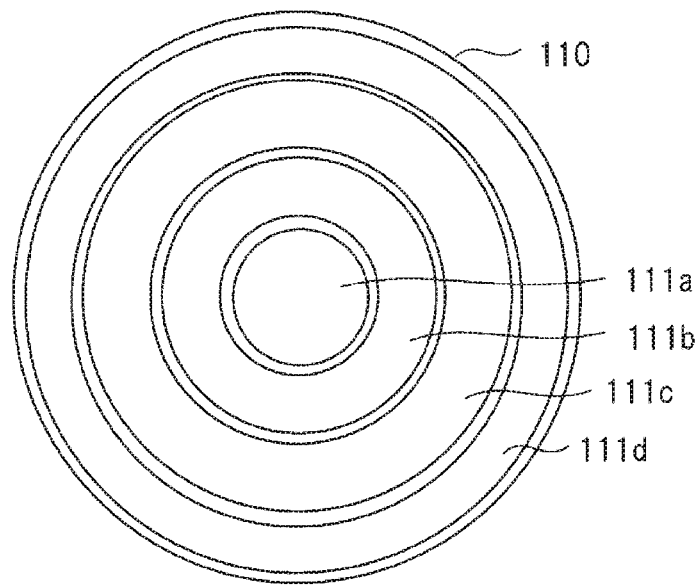
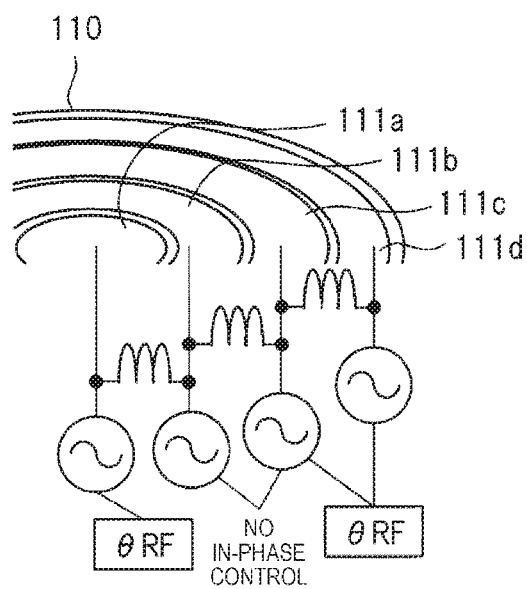

FIG. 16
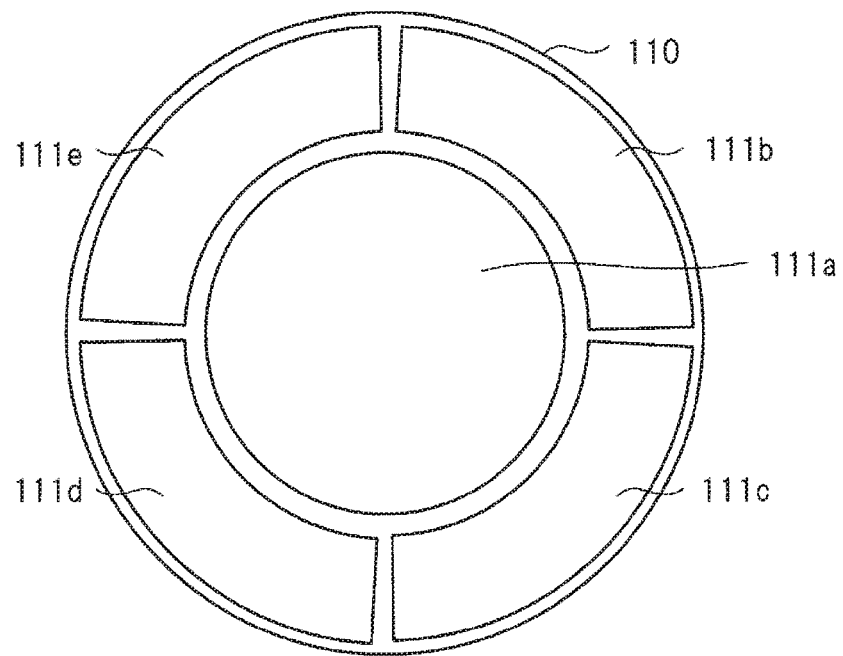
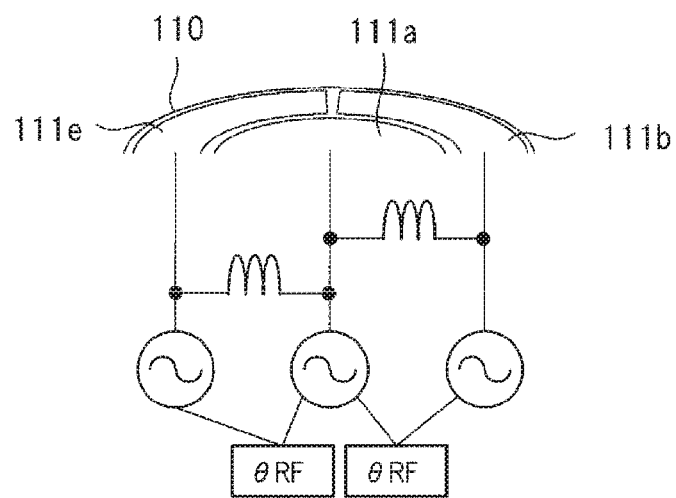

PLASMA PROCESSING APPARATUS AND PLASMA PROCESSING METHOD

BACKGROUND OF THE INVENTION

Field of the Invention

The present invention relates to a plasma processing apparatus and a plasma processing method, and in particular to a technique effective for plasma etching suitable for processing a material to be processed such as a semiconductor element substrate.

Background Art

In a semiconductor manufacturing process, dry etching using plasma is generally performed. Various types of plasma processing apparatuses for performing dry etching are used. Generally, in a plasma processing apparatus, etching of a wafer held on a wafer placement electrode is performed by setting a processing gas supplied from a shower plate or the like into a vacuum processing chamber to a plasma state by a plasma generating unit for generating plasma in the vacuum processing chamber.

In recent years, with the improvement of the degree of integration of semiconductor devices, fine processing, that is, improvement of processing accuracy is required, and in particular, it is required to improve the in-plane uniformity of an etching rate or the in-plane uniformity of the wafer of a critical dimension (CD) value in an etching pattern shape.

The in-plane uniformity of the etching processing is affected by a plasma density distribution, a gas reaction product distribution, a wafer in-plane temperature distribution, and an in-plane distribution of incident ion energy. As a technique for improving or controlling non-uniformity in the wafer in-plane etching rate or CD, there has been proposed a method of addressing electric problems around the wafer, particularly by controlling the distribution of ion energy in the wafer plane.

JP-A-2007-67037 discloses that bias powers applied from the two radio frequency bias power supplies are controlled independently for a sample stage block on the center side of a sample stage which is an electrode and a sample stage block on the outer peripheral side of the sample stage in a plasma processing apparatus for processing a sample using the sample stage which is the electrode divided into two concentrically.

In addition, JP-A-2004-22822 discloses a configuration in which two internal radio frequency bias power supplies are supplied and applied to an inner stage and an outer stage of an electrode table, and the phases of the respective radio frequency powers are controlled to be the same or under control in a plasma processing apparatus for processing a sample by using an electrode base divided into two stages of an inner stage on the center side of a concentric circle on which the sample is placed and an outer stage on the outer peripheral side of a circumferential area on which the sample is placed.

By controlling the phases of each radio frequency power to be the same or under control and applying the phases and by giving a difference between the powers of the inner stage and the outer stage, a peak-to-peak voltage (hereinafter, referred to as Vpp) of a radio frequency RF bias applied to the sample on the electrode table is different approximately between the inner portion and the outer portion of the sample on the electrode table, and the distribution of ion energy in the wafer plane may be changed.

SUMMARY OF THE INVENTION

In the case of a technique for improving the in-plane uniformity of etching by controlling a radio frequency RF bias applied to a plurality of regions within an electrode surface, particularly the magnitude of Vpp, there is no problem if the miniaturization is at a current level, but as the level of miniaturization further advances, the sensitivity of an etching rate to a phase difference between the radio frequency RF biases applied to the plurality of regions is increased, and there is a problem that the phase difference of the radio frequency RF biases may not be ignored.

As a result, an intended etching rate distribution may not be obtained, or the etching may not be performed with good reproducibility, which in turn causes a problem that the performance of each apparatus changes.

An object of the present invention is to provide a technique capable of simultaneously achieving good etching uniformity and reproducibility in plasma processing.

The above and other objects and novel features of the present invention will become apparent from the description of the present specification and the accompanying drawings.

Outline of representative ones of the inventions disclosed in the present application will be briefly described as follows.

That is, a typical plasma processing apparatus includes a vacuum processing chamber, a sample stage, a first radio frequency power supply, a second radio frequency power supply, a third radio frequency power supply, and a control device. In the vacuum processing chamber, the sample is subjected to plasma processing. The sample stage is provided with a first electrode for electrostatically adsorbing the sample and a second electrode disposed outside the first electrode for electrostatically adsorbing the sample, and the sample is placed thereon.

The first radio frequency power supply supplies a first radio frequency power to the first electrode via a first transmission path. The second radio frequency power supply supplies a second radio frequency power having the same frequency as the frequency of the first radio frequency power to the second electrode via a second transmission path. The third radio frequency power supply supplies a third radio frequency power for generating plasma.

The control device controls a phase difference between a phase of the first radio frequency power and a phase of the second radio frequency power so that a phase of a radio frequency voltage applied to the first electrode and a phase of a radio frequency voltage applied to the second electrode are substantially equal.

In addition, the plasma processing apparatus includes a crosstalk suppression unit. The crosstalk suppression unit is disposed between the first transmission path and the second transmission path for suppressing crosstalk that causes one of the transmission paths to affect the other transmission path.

In particular, the crosstalk suppression unit has an inductance, and the value of the inductance is a value at which crosstalk between the first transmission path and the second transmission path is suppressed.

Effects obtained by representative ones of the inventions disclosed in the present application will be briefly described as follows.

It is possible to perform etching with high reproducibility and high uniformity.

BRIEF DESCRIPTION OF THE DRAWINGS

FIG. 5 is an explanatory diagram showing an example of phase measurement in a phase difference measurement device included in the microwave ECR etching apparatus of FIG. 1.

FIG. 7 is a flowchart showing a processing example of in-phase control in a radio frequency RF bias by the microwave ECR etching apparatus of FIG. 1.

FIG. 8 is a flowchart showing another processing example of the in-phase control of FIG. 7.

FIGS. 13A and 13B are explanatory diagrams showing an example of a change in the etching rate distribution when there are the phase difference and the Vpp difference according to studies of the inventors of the present invention.

FIG. 14 is an explanatory diagram showing an example at the time of applying a radio frequency RF bias according to Embodiment 2.

FIG. 15 is an explanatory diagram showing an example of electrode division in a placement electrode of FIG. 14.

FIG. 16 is an explanatory diagram showing another example of the electrode division of FIG. 15.

DETAILED DESCRIPTION OF THE INVENTION

Figure 1:
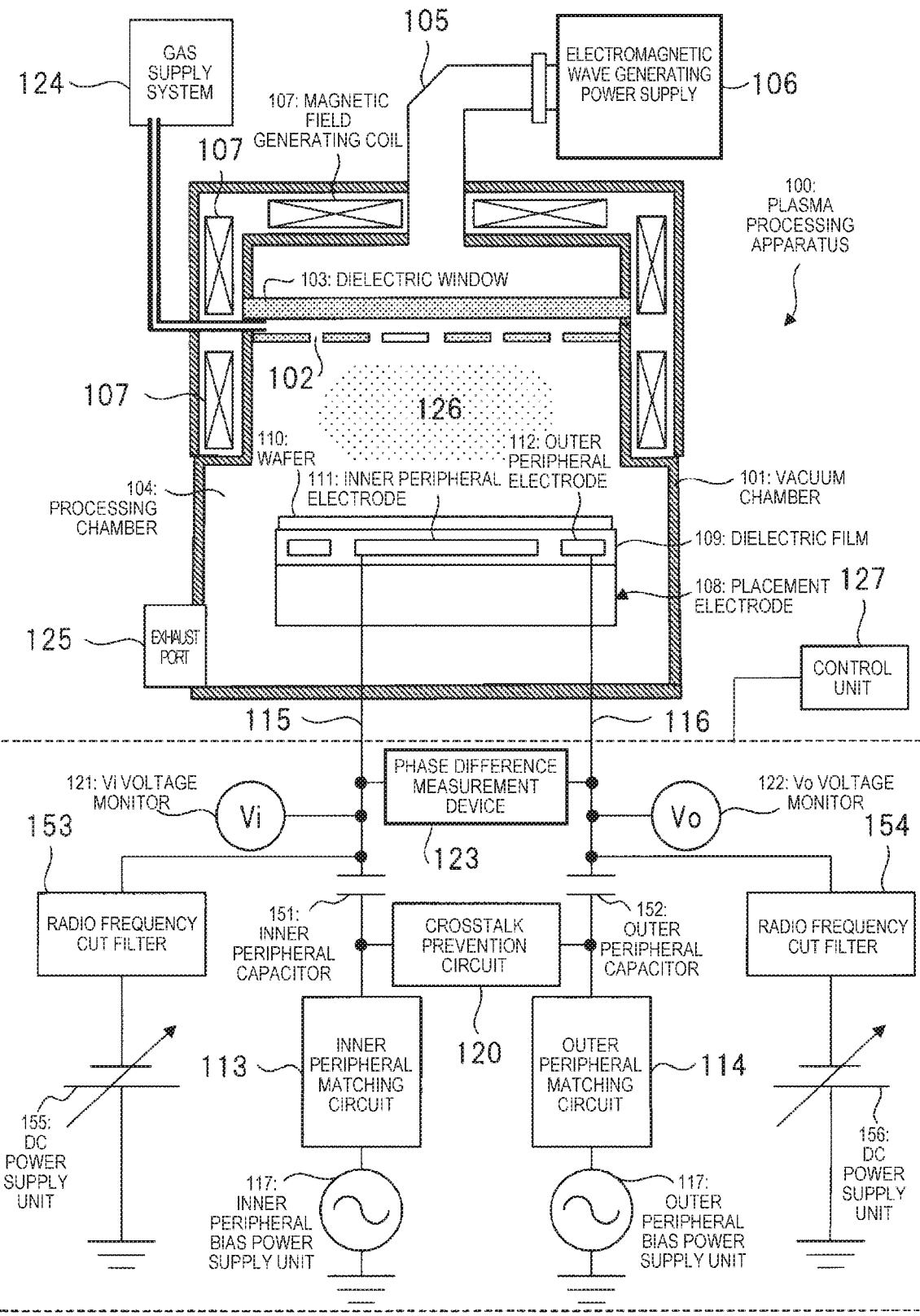
FIG. 1 is an explanatory diagram showing an example of a configuration in a microwave ECR etching apparatus according to Embodiment 1.

In all the drawings for describing the embodiments, the same members are denoted by the same reference numerals in principle, and the repetitive description thereof will be omitted.

Embodiment 1

Hereinafter, embodiments will be described in detail.

Configuration Example of Plasma Processing Apparatus

FIG. 1 is an explanatory diagram showing an example of a configuration of a plasma processing apparatus 100 according to Embodiment 1.

The plasma processing apparatus 100 is composed of, for example, a microwave electron cyclotron resonance (ECR) etching apparatus and includes a processing chamber 104 which is a vacuum processing chamber as shown in FIG. 1. The processing chamber 104 includes a vacuum chamber 101, a quartz shower plate 102, and a dielectric window 103.

The dielectric window 103 is provided above the vacuum chamber 101, and an etching gas is sealed in the vacuum chamber 101 by the dielectric window 103. The dielectric window 103 is made of, for example, quartz. The quartz shower plate 102 is provided below the dielectric window 103. In addition, a vacuum evacuation apparatus (not shown) is connected to the vacuum chamber 101 via an exhaust port 125.

Above the dielectric window 103, a waveguide 105 for transmitting electromagnetic waves is provided. A power for generating plasma is transmitted to the processing chamber 104 by the waveguide 105. The electromagnetic wave generated by an electromagnetic wave generating power supply 106 is input to the processing chamber 104 via the waveguide 105.

As the frequency of the electromagnetic wave, for example, a microwave of about 2.45 GHz is used. A magnetic field generating coil 107 for forming a magnetic field is provided on the outer peripheral portion of the processing chamber 104. Due to the interaction with the magnetic field formed by the magnetic field generating coil 107, the power oscillated by the electromagnetic wave generating power supply 106 generates high-density plasma 126 in the processing chamber 104.

The waveguide 105, the electromagnetic wave generating power supply 106, the magnetic field generating coil 107, and the like constitute a plasma generating portion.

Inside the vacuum chamber 101, a placement electrode 108 is provided so as to face the dielectric window 103. The placement electrode 108 places a wafer 110 such as a semiconductor element substrate which is a sample.

A dielectric film 109 having a sprayed film of alumina, ceramics or the like is formed on the placement electrode 108. Inside the dielectric film 109, an inner peripheral electrode 111 which is a first electrode and an outer peripheral electrode 112 which is a second electrode are respectively provided.

The inner peripheral electrode 111 is an electrode having a film-like disc shape and is disposed at the center of the dielectric film 109. The outer peripheral electrode 112 is an electrode having a film-like ring shape and is disposed on the outer peripheral side so as to surround the inner peripheral electrode 111.

To the inner peripheral electrode 111 and the outer peripheral electrode 112, a DC power supply unit 155 which is a first radio frequency power supply and a DC power supply unit 156 which is a second radio frequency power supply are connected via a radio frequency cut filter 153 and a radio frequency cut filter 154, and the wafer 110 is adsorbed by an electrostatic force. The areas of the inner peripheral electrode 111 and the outer peripheral electrode 112 are set to the same extent in order to realize uniform wafer adsorption.

An inner peripheral matching circuit 113 is connected to the inner peripheral electrode 111 via an inner peripheral capacitor 151. An outer peripheral matching circuit 114 is connected to the outer peripheral electrode 112 via an outer peripheral capacitor 152.

An inner peripheral bias power supply unit 117 is connected to the inner peripheral matching circuit 113, and an outer peripheral bias power supply unit 118 is connected to the outer peripheral matching circuit 114. The inner peripheral capacitor 151 and the outer peripheral capacitor 152 cut off a DC voltage for wafer adsorption.

Here, the line between the inner peripheral electrode 111 and the inner peripheral matching circuit 113 is defined as an inner peripheral transmission path 115, the line between the outer peripheral electrode 112 and the outer peripheral matching circuit 114 is defined as an outer peripheral transmission path 116. The inner peripheral transmission path 115 is a first transmission path, and the outer peripheral transmission path 116 is a second transmission path.

When etching processing is started, the wafer 110 is conveyed into the processing chamber 104. After the wafer 110 is adsorbed by the placement electrode 108, an etching gas is introduced. The etching gas passes from a gas supply system 124 via a mass flow controller (not shown) between the dielectric window 103 and the quartz shower plate 102. Then, the etching gas is introduced into the processing chamber 104 from the gas holes of the quartz shower plate 102.

When the interior of the vacuum chamber 101 reaches a predetermined pressure, an electromagnetic wave generating power supply 106, which is a third radio frequency power supply, generates plasma in the processing chamber 104 by applying microwaves. A radio frequency bias is oscillated from the inner peripheral bias power supply unit 117 and the outer peripheral bias power supply unit 118 and applied to the inner peripheral electrode 111 and the outer peripheral electrode 112. As a result, ions are drawn from the plasma 126 to the wafer 110 and etching progresses. A reaction product generated by the etching gas or etching is exhausted from the exhaust port 125.

A Vi voltage monitor 121 is connected to the inner peripheral transmission path 115, and a Vo voltage monitor 122 is connected to the outer peripheral transmission path 116. The Vi voltage monitor 121 and the Vo voltage monitor 122 detect and measure the voltages of the inner peripheral transmission path 115 and the outer peripheral transmission path 116, respectively.

The Vi voltage monitor 121 and the Vo voltage monitor 122 may be any as long as the monitors may measure the peak-to-peak voltage Vpp, but more preferably, may be any as long as the monitors may monitor the voltage with a high-time resolution constituted by an A/D converter or the like.

In the case of a monitor with a high-time resolution constituted by an A/D converter or the like, it is possible to measure the Vpp even if the radio frequency bias is intermittently applied or time-modulated. In addition, it is possible to measure the Vpp of the radio frequency bias, the phase of each transmission path and the phase difference between transmission paths with high accuracy even when the voltage of the radio frequency bias is accompanied by distortion.

In addition, a crosstalk prevention circuit 120 and a phase difference measurement device 123 are connected between the inner peripheral transmission path 115 and the outer peripheral transmission path 116, respectively. The crosstalk prevention circuit 120, which is a crosstalk suppression unit, suppresses crosstalk. The phase difference measurement device 123 measures the phase difference between the inner peripheral electrode 111 and the outer peripheral electrode 112.

The control device 127 controls operations of the crosstalk prevention circuit 120, the inner peripheral bias power supply unit 117, the outer peripheral bias power supply unit 118, and the like based on the measurement results of the Vi voltage monitor 121, the Vo voltage monitor 122, the phase difference measurement device 123.

In addition, the inner peripheral matching circuit 113, the outer peripheral matching circuit 114, the inner peripheral bias power supply unit 117, the outer peripheral bias power supply unit 118, the crosstalk prevention circuit 120, the Vi voltage monitor 121, the Vo voltage monitor 122, the phase difference measurement device 123, the inner peripheral capacitor 151, the outer peripheral capacitor 152, and the control device 127 constitute a radio frequency bias power control application unit.

Application Example of Radio Frequency Bias

Figure 2:
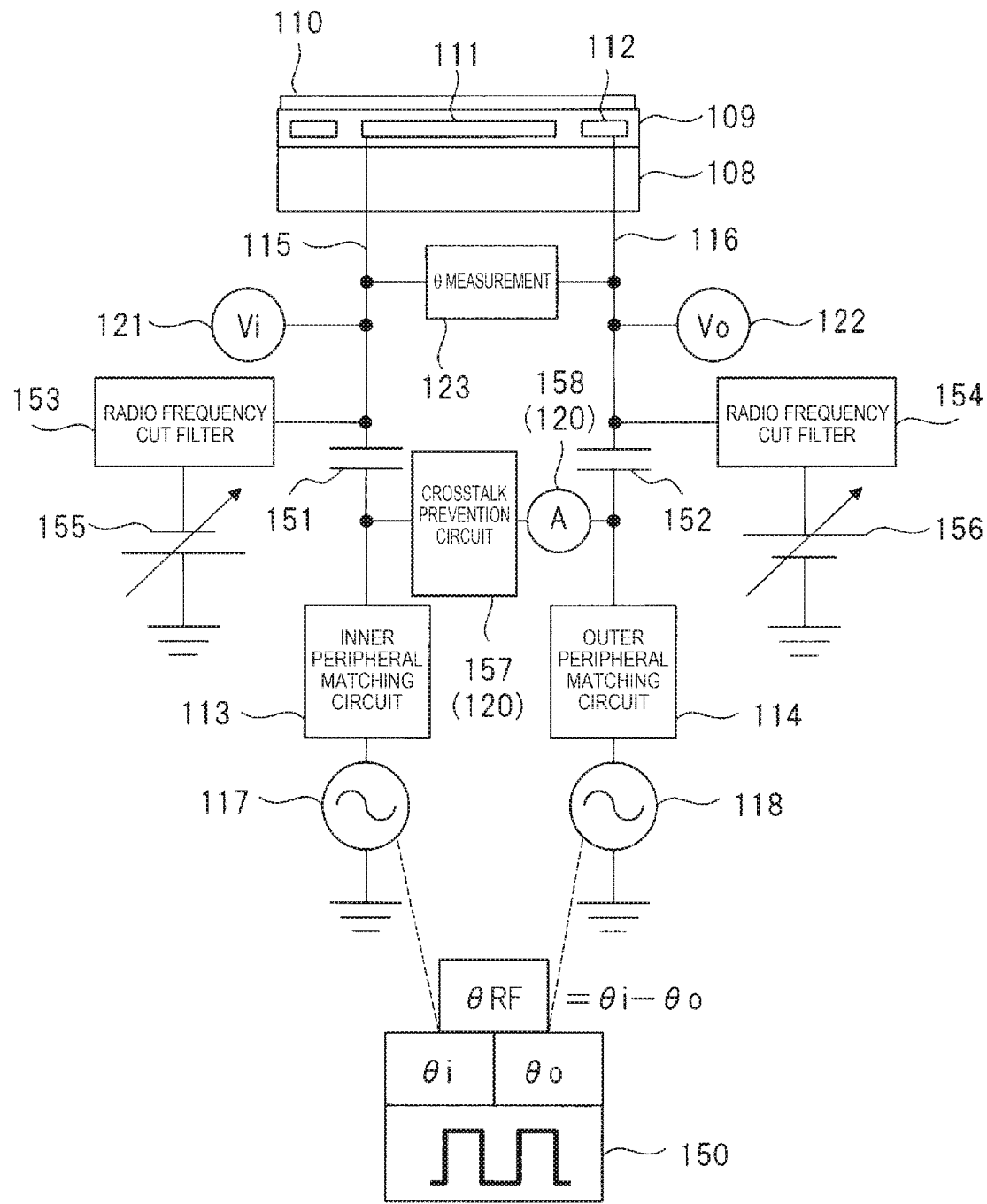
FIG. 2 is an explanatory diagram showing an example at the time of applying a radio frequency RF bias in the microwave ECR etching apparatus of FIG. 1.

FIG. 2 is an explanatory diagram showing an example of applying a radio frequency bias in the plasma processing apparatus 100 of FIG. 1.

FIG. 2 shows details of a technique for applying a radio frequency bias to the inner peripheral electrode 111 and the outer peripheral electrode 112 in phase. In addition, FIG. 2 focuses on the placement electrode 108 of the FIG. 1, the inner peripheral matching circuit 113, the outer peripheral matching circuit 114, the inner peripheral bias power supply unit 117, the outer peripheral bias power supply unit 118, the crosstalk prevention circuit 120, the Vi voltage monitor 121, the Vo voltage monitor 122, the phase difference measurement device 123, the inner peripheral capacitor 151, the outer peripheral capacitor 152, the radio frequency cut filters 153 and 154, and DC power supply units 155 and 156.

The inner peripheral bias power supply unit 117 and the outer peripheral bias power supply unit 118 may be set to a random radio frequency bias. Here, it is assumed that the frequency of the radio frequency bias is about 400 KHz.

The inner peripheral bias power supply unit 117 and the outer peripheral bias power supply unit 118 are required to oscillate a radio frequency bias at the same frequency. The reason is that when there is a slight difference in frequency, a beat signal is generated to prevent problems such as malfunction of the bias power supply units 117 and 118 due to reflected waves caused by the beat, matching malfunction of the matching circuits 113 and 114, and the like. Another reason is to prevent the application of a radio frequency bias in which the bias power supply units 117 and 118 are not constant due to the beat signal.

In order to oscillate at the same frequency, it is preferable that the inner peripheral bias power supply unit 117 and the outer peripheral bias power supply unit 118 oscillate a radio frequency bias based on the same reference clock signal 150 instead of oscillating a radio frequency bias of about 400 KHz, respectively.

The inner peripheral matching circuit 113 and the outer peripheral matching circuit 114 independently operate. That is, the inner peripheral matching circuit 113 and the outer peripheral matching circuit 114 detect the power of the incident wave and the reflected wave of the radio frequency bias.

As described above, the inner peripheral capacitor 151 and the outer peripheral capacitor 152 are connected to the output portions of the inner peripheral matching circuit 113 and the outer peripheral matching circuit 114, respectively.

In addition, the DC power supply units 155 and 156 are connected to the inner peripheral transmission path 115 and the outer peripheral transmission path 116 via the radio frequency cut filters 153 and 154 between the inner peripheral capacitor 151 and the inner peripheral electrode 111 and between the outer peripheral capacitor 152 and the outer peripheral electrode 112, respectively. In other words, a radio frequency bias of about 400 KHz and a direct current (DC) voltage for wafer adsorption are superimposed and applied to the inner peripheral electrode 111 and the outer peripheral electrode 112, respectively.

In order to precisely measure a voltage, particularly a phase, of a radio frequency bias, the Vi voltage monitor 121, it is necessary to install the Vo voltage monitor 122, and the phase difference measurement device 123 as close to the wafer 110 or the inner peripheral electrode 111 and the outer peripheral electrode 112 as possible in the inner peripheral transmission path 115 and the outer peripheral transmission path 116.

In addition, it is necessary to set both the distances from the monitor measurement positions of the Vi voltage monitor 121 and the Vo voltage monitor 122 to the inner peripheral electrode 111 and the outer peripheral electrode 112 to be the same. Otherwise, the phase difference may not be measured correctly, or the measurement of Vpp may be inaccurate.

The crosstalk prevention circuit 120 connected between the inner peripheral transmission path 115 and the outer peripheral transmission path 116 suppresses crosstalk as described above. When the radio frequency bias applied to one side is propagated to the other side, crosstalk is caused by a reflected wave for the other side.

If the crosstalk is not suppressed, there are problems such as malfunction of the bias power supply units 117 and 118, matching malfunction of the matching circuits 113 and 114, increased reflected waves, or application of a radio frequency bias is unstable due to the action of the reflected wave.

The crosstalk prevention circuit 120 is composed of, for example, an inductance 157 which is an inductance circuit and an ammeter 158. The inductance value of the inductance 157 is adjusted by the control device 127, for example. Crosstalk is adjusted by changing the inductance value. Here, when viewed from the inner peripheral electrode 111, the outer peripheral electrode 112 is electrically regarded as a capacitance component.

In addition, since plasma during the etching processing is also regarded as a capacitance and a resistance component, and furthermore, the wafer 110 itself, the placement electrode 108 in the state where the wafer 110 is placed, the inner peripheral capacitor 151, the outer peripheral capacitor 152, and the like are all regarded as capacitance components, combinations of all of these may be regarded as almost synthetic capacitances.

The inductance value of the inductance 157 in the crosstalk prevention circuit 120 and the capacitance between the inner peripheral transmission path 115 and the outer peripheral transmission path 116 are set to be LC resonance, and the impedance of the other electrode viewed from either the inner peripheral electrode 111 or the outer peripheral electrode 112 is increased so as not to interfere with each other as an electric circuit.

Example of Crosstalk Suppression

Figure 3:
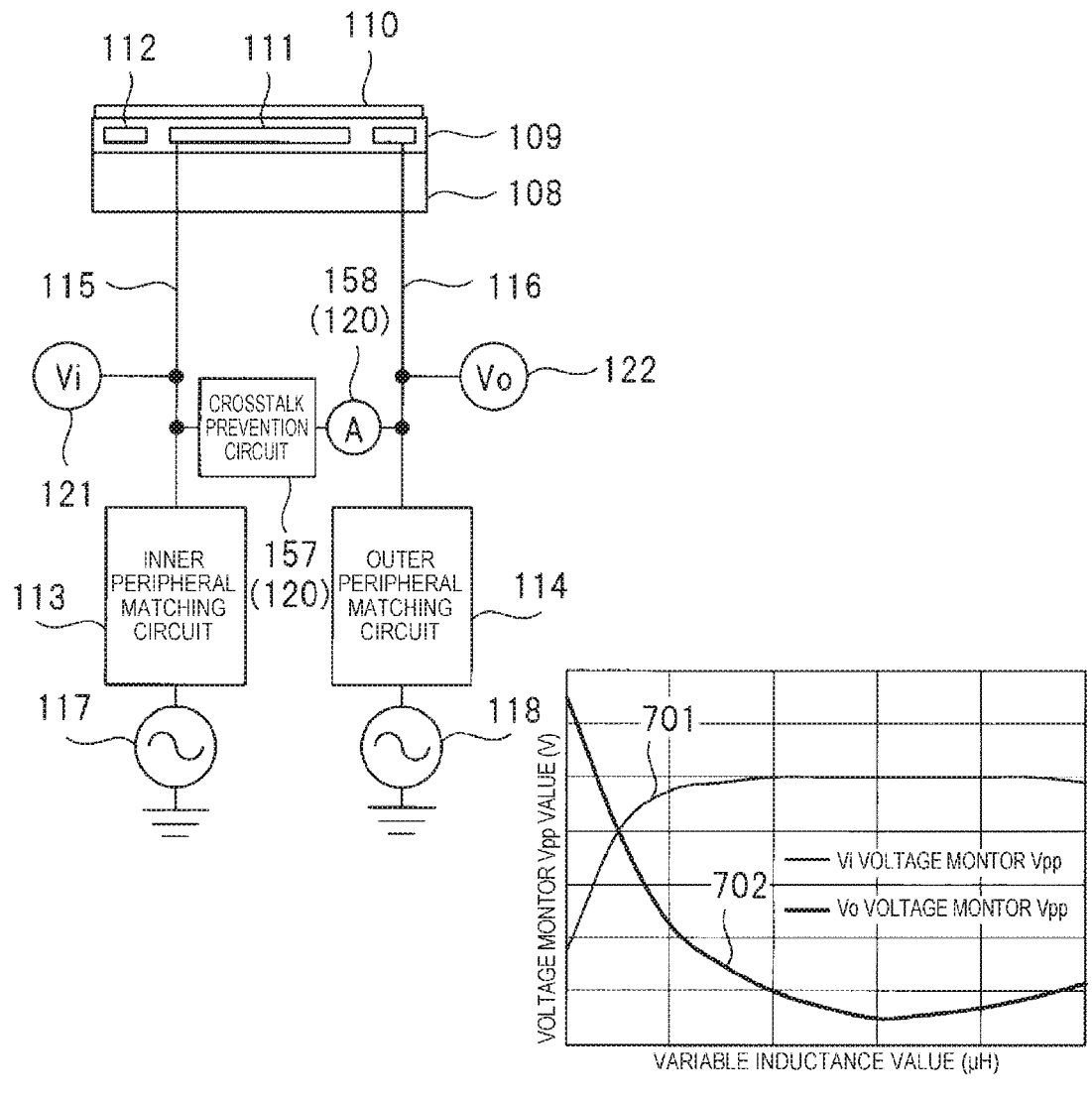
FIG. 3 is an explanatory diagram showing a crosstalk suppression operation by a crosstalk prevention circuit included in the microwave ECR etching apparatus of FIG. 1.

FIG. 3 is an explanatory diagram showing a crosstalk suppression operation by the crosstalk prevention circuit 120 of the plasma processing apparatus 100 of FIG. 1. It is assumed that the processing shown below is performed by the control device 127 as a main component.

As shown in FIG. 3, Regarding the suppression control of crosstalk, after plasma is generated by turning on the electromagnetic wave generating power supply 106, a radio frequency bias is applied to either the inner peripheral bias power supply unit 117 or the outer peripheral bias power supply unit 118. Here, FIG. 3 shows an example in which a radio frequency bias is applied by the inner peripheral bias power supply unit 117.

At that time, the voltages of the inner peripheral transmission path 115 and the outer peripheral transmission path 116 by the Vi voltage monitor 121 and the Vo voltage monitor 122, that is, the Vi voltage monitor Vpp value as a curve 701 in FIG. 3 and the Vo voltage monitor Vpp value as a curve 702 in FIG. 3 are measured, respectively.

If the inductance 157 in the crosstalk prevention circuit 120 is adjusted, and Vo/Vi of Vpp which indicates the degree of how much crosstalk may be suppressed, that is a curve 703 in FIG. 3 is minimized, crosstalk is minimal.

For example, assuming that Vo/Vi is $1/10$, crosstalk is $1/100$ in terms of power conversion. In a case where Vo/Vi is less than $1/10$, it may be regarded that there is almost no crosstalk.

Ideally, it is desirable to control so that crosstalk is minimum, that is, Vo/Vi takes a minimum value, but a certain reference value may be provided and it may be regarded that there is no crosstalk if Vo/Vi is less than the value.

When actually applying a plurality of radio frequency bias to the same placement electrode, it is impossible that the crosstalk is zero. The reference value is set from the three viewpoints of the degree of crosstalk without the crosstalk prevention circuit, prevention of malfunction of the bias power supply units due to crosstalk, and a range within which the occurrence of a phase difference due to the crosstalk described above may be suppressed.

According to the viewpoints, it is good to set the inductance 157 which satisfies $1.5/10=15(\%)=-16.4$ (dB) or less as Vo/Vi of Vpp which indicates the degree of how much crosstalk may be suppressed, and the range of the inductance value is about 100 microhenries±20%.

In the case of investigating the crosstalk between the inner peripheral transmission path 115 and the outer peripheral transmission path 116, it is sufficient to adjust an inductance only by applying a radio frequency bias by either one of the bias power supply units, for example, the inner peripheral bias power supply unit 117 in this example, and it is possible to omit the method of applying a radio frequency bias only by the outer peripheral bias power supply unit 118 which is the reverse side.

After sufficiently suppressing the above-described crosstalk, a preset radio frequency bias is applied.

In this example, only the radio frequency bias of the inner peripheral bias power supply unit 117 is applied to suppress the crosstalk, and thereafter the radio frequency bias of the outer peripheral bias power supply unit 118 is also applied. That is, at this point, a desired radio frequency bias is applied to both the inner peripheral electrode 111 and the outer peripheral electrode 112.

Example of Phase Difference Control of Radio Frequency Bias

Figure 4:
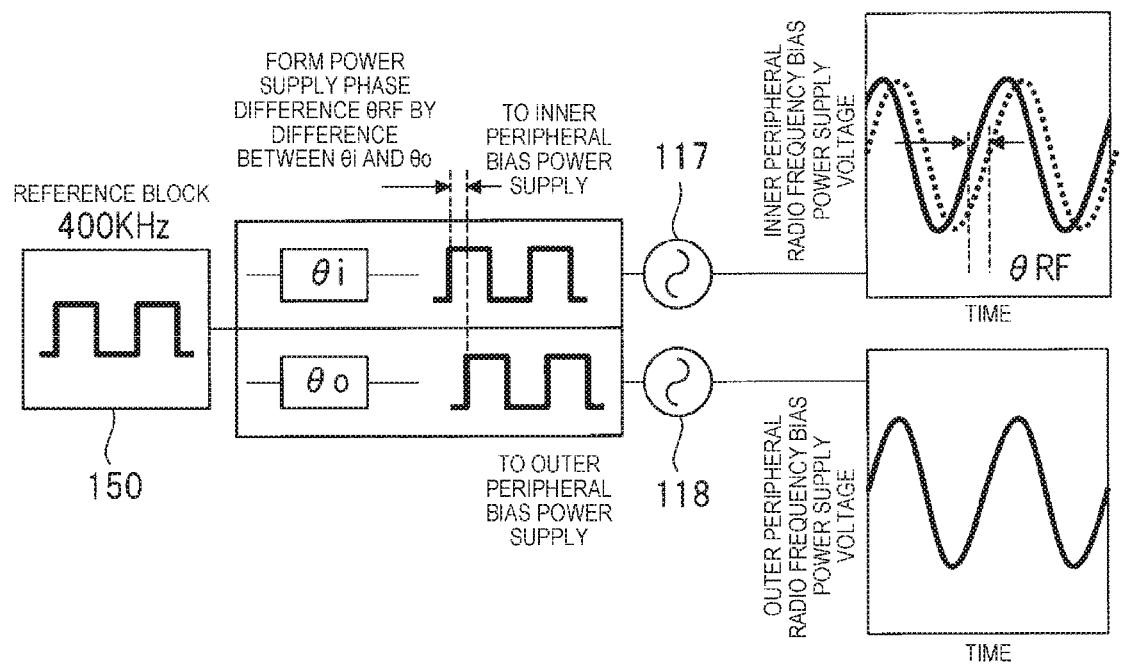
FIG. 4 is an explanatory diagram showing an example of control of a phase difference in a radio frequency RF bias by the microwave ECR etching apparatus of FIG. 1.

FIG. 4 is an explanatory diagram showing an example of control of a phase difference in the radio frequency bias by the plasma processing apparatus 100 of FIG. 1. It is assumed that the processing of FIG. 4 is also performed by the control device 127 as a main component.

Following the processing of suppressing the crosstalk, the phase of the radio frequency bias applied to the wafer 110 is adjusted. As shown in FIG. 4, the phase adjustment of the radio frequency bias is performed by changing the reference clock signal 150 of about 400 KHz supplied to one side of the bias power supply units of the inner peripheral bias power supply unit 117 and the outer peripheral bias power supply unit 118 by a power supply phase difference ORF to control the phase difference by oscillating the radio frequency bias on the basis thereof.

In FIG. 4, the power supply phase difference θRF indicates the phase difference of the radio frequency bias generated by the inner peripheral bias power supply unit 117 and the outer peripheral bias power supply unit 118. θi is a clock signal for oscillating the radio frequency bias by the inner peripheral bias power supply unit 117, and θo is a clock signal for oscillating the radio frequency bias by the outer peripheral bias power supply unit 118, respectively.

The control device 127 outputs a control signal for controlling the phase difference between the clock signal θi and the clock signal θo so that the phase difference of the radio frequency biases generated by the inner peripheral bias power supply unit 117 and the outer peripheral bias power supply unit 118 becomes the power supply phase difference θRF.

The inner peripheral bias power supply unit 117 and the outer peripheral bias power supply unit 118 have a clock generation unit (not shown) and generate the clock signals θi and θo based on the control signal output from the control device 127.

As another method of the bias power supply units 117 and 118, it is conceivable to provide a delay circuit on the oscillation by the same oscillator, that is, on the transmission path of either the inner peripheral transmission path 115 or the outer peripheral transmission path 116 to control the phase by either one of the bias power supply units. In that case, crosstalk excessively generated by the delay circuit should be taken into consideration.

In addition, it is also necessary to distribute the power of either one of the bias power supply units to the inner peripheral electrode 111 and the outer peripheral electrode 112, respectively, but at that time, crosstalk should also be considered sufficient for a power distribution circuit that distributes the power.

When the power of the inner peripheral bias power supply unit 117 and the power of the outer peripheral bias power supply unit 118 are the same and an initial phase difference oscillated by the bias power supply units 117 and 118 is applied at zero, if the phase difference by the phase difference measurement device 123 happens to be zero, the Vpp value of the Vi voltage monitor 121 and the Vpp value of the Vo voltage monitor 122 may have the same matching position of the inner peripheral matching circuit 113 and the outer peripheral matching circuit 114. In this case, adjustment of the phase difference is unnecessary.

However, under usual etching conditions, there are many cases where there is a difference in the power of the bias power supply units 117 and 118 to be set. When receiving a reference clock signal 150 which is a reference signal and oscillating the radio frequency bias, if there is a difference between large electric power and small electric power, a shift of the oscillation time of the radio frequency bias, that is, a phase shift occurs.

Alternatively, a phase shift due to a difference in the matching position between the inner peripheral matching circuit 113 and the outer peripheral matching circuit 114 or a phase shift due to a plasma load such as a plasma sheath occurs.

As a result, adjustment of the power supply phase difference is basically necessary for each etching condition, but as an exception, if the etching condition and the resistance value of the processed wafer are fixed or repeated, and the inductance position is already set to A as data and the phase difference between the two radio frequency biases is set to B degrees, in a case where it is known that the phase difference of the radio frequency biases applied to the wafer is zero, the control may be omitted.

Operation Example of Phase Difference Measurement Device

FIG. 5 is an explanatory diagram showing an example of phase measurement in the phase difference measurement device 123 included in the plasma processing apparatus 100 of FIG. 1.

The processing shown in FIGS. 5 and 6 is also performed by the control device 127 as a main component. As described above, the phase difference between the inner peripheral electrode 111 and the outer peripheral electrode 112 is measured by the phase difference measurement device 123. It is desirable that the phase difference measurement device 123 shown in the lower part of FIG. 5 may detect the phase difference of the radio frequency biases in phase, phase lead, or phase delay by several degrees.

As to which phase point the phase difference voltage is measured, the phase difference varies depending on the point, as shown by measured phase differences 901, 902, and 903 in the upper part of FIG. 5, but since the minimum value of the radio frequency bias voltage has the greatest influence on an etching rate, if the point of the phase difference measurement is one point, it is desirable to adopt the measured phase difference 903 of a voltage minimum point.

Alternatively, the Vi voltage monitor 121 and the Vo voltage monitor 122 capable of monitoring the voltage with high temporal resolution as indicated by curves 905 and 906 in FIG. 5 may also measure the phase difference between the respective measurement results.

The phase difference measurement device 123 measures the respective phase differences at all the sampling points of the voltage waveform of one period measured by the Vi voltage monitor 121 and the Vo voltage monitor 122. Then, the average value of all the measured phase differences is calculated, and the calculated result is output to the control device 127 as a phase difference.

In this case, determination takes time, but there is an advantage that it is possible to detect a phase difference even if there is some degree of distortion in an RF bias waveform. In addition, since it is possible to measure the phase difference even with the phase of all the points, there is an advantage that it is possible to more strictly determine the phase difference.

Another Example of Phase Measurement

Figure 6A:
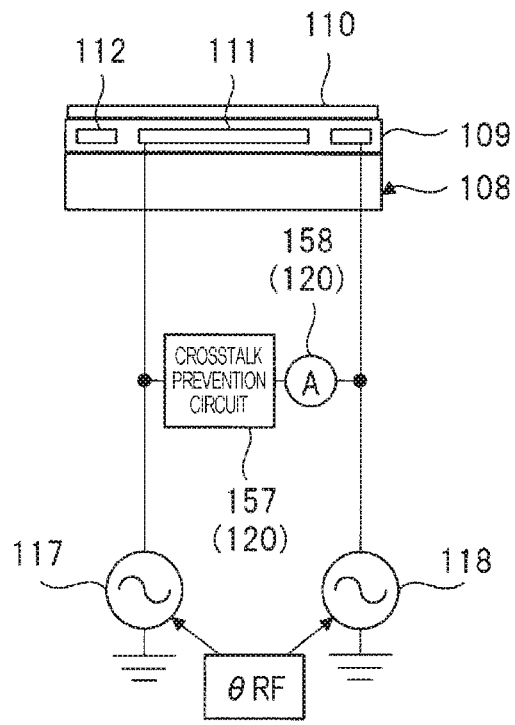
FIGS. 6A and 6B are explanatory diagrams showing another example in the phase measurement of FIG. 5.
Figure 6B:
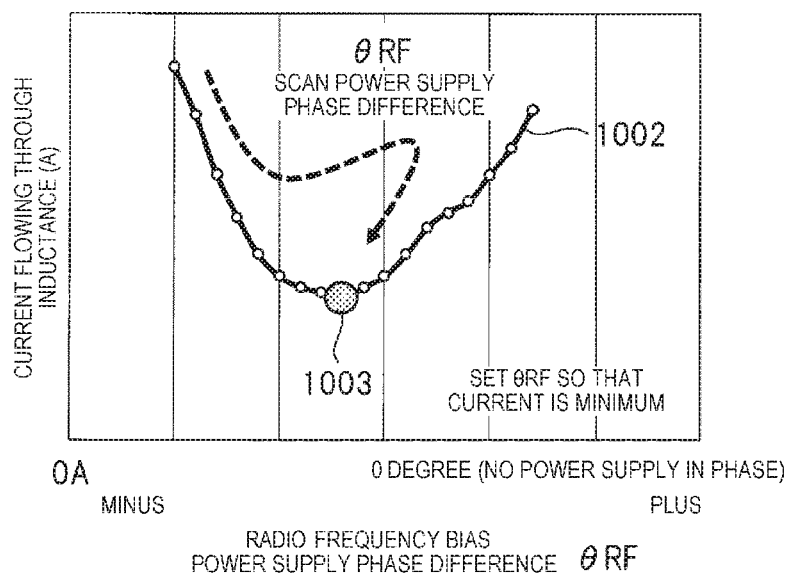

FIGS. 6A and 6B are explanatory diagrams showing another example in the phase measurement of FIG. 5.

FIGS. 6A and 6B show an example in which the phase is controlled by an inductance current.

As a technique for controlling the phase difference without using the phase difference measurement device 123, for example, as shown in FIG. 6A, the control device 127 adjusts the power supply phase difference θRF so that the value of the ammeter 158 for measuring the current flowing through the inductance 157 of the crosstalk prevention circuit 120 is minimized.

As a specific method, the power supply phase difference θRF is scanned from minus to plus, for example, the power supply phase difference is scanned from a state where the phase on the inner peripheral portion side is 5° earlier to a state where the phase on the outer peripheral portion side is 5° earlier. The current flowing through the inductance 157 varies as indicated by a curve 1002 in FIG. 6B due to the phase difference.

The phase difference of the oscillated radio frequency biases is controlled so as to minimize a current value, and finally the phase difference of a circular mark 1003 in FIG. 6B is determined. In this technique, since the phase difference of the whole period of the radio frequency biases is accurately reflected and represented, it is possible to determine an inductance current with high accuracy.

In addition, it is possible to detect the phase difference even when the phase difference may not be detected by the phase difference measurement device 123 in a combination in which there is an extreme difference in power between the inner peripheral bias power supply unit 117 and the outer peripheral bias power supply unit 118. Therefore, it is possible to detect the phase difference regardless of the distortion of the waveform of the radio frequency bias voltage.

Here, two of the ammeter 158 and the phase difference measurement device 123 are used. First, an approximate phase difference is measured by the phase difference measurement device 123, a power supply phase difference range to be scanned is determined based on the measured phase difference, and the current value flowing through the inductance 157 is controlled to be minimized.

In addition, instead of minimizing the current flowing through the inductance 157, in all ranges from 0 to 360 degrees of the power supply phase difference of the radio frequency biases, the current value of a lower %, for example, the lower 3% of the current value when the current flowing in the inductance 157 is plot may be regarded as the minimum current value.

Process Example of Phase Control

FIG. 7 is a flowchart showing a processing example of in-phase control in the radio frequency bias by the plasma processing apparatus 100 in FIG. 1. FIG. 8 is a flowchart showing another processing example of the in-phase control of FIG. 7.

FIG. 7 shows an example of processing using phase control according to FIG. 5, and FIG. 8 shows an example of processing using phase control by an inductance current. The processing of FIGS. 7 and 8 is also performed mainly by the control device 127.

In both cases of FIGS. 7 and 8, it is preferable that a control sequence for applying a radio frequency bias in phase to the inner peripheral portion and the outer peripheral portion of the wafer is first, prevention of crosstalk (steps S101 and S102 in FIG. 7, and steps S201 and S202 in FIG. 8), subsequently, applying a plurality of set RF biases (step S103 in FIG. 7 and step S203 in FIG. 8), and finally, adjusting of a power supply phase difference (steps S104 and S105 in FIG. 7, and steps S204 and S205 in FIG. 8).

This is because if the phase adjustment is performed without suppressing the crosstalk, the voltage waveform of the RF bias is distorted, it is difficult to adjust the phase measurement, and if the radio frequency bias after the phase adjustment is changed, the phase difference will change only by the change.

Here, the problem of the technique for improving the in-plane uniformity by controlling the radio frequency bias applied to the electrode, particularly the magnitude of Vpp, as described in the background art will be described in detail.

As described in the background art, this is not a problem if the miniaturization is at the current level, but as the miniaturization level further advances, the sensitivity of the etching rate to the phase difference between the respective radio frequency biases applied to the plurality of regions is increased, and the phase difference of the radio frequency biases may not be ignored.

Examination Example by Inventors of Present Invention

Figure 9A:
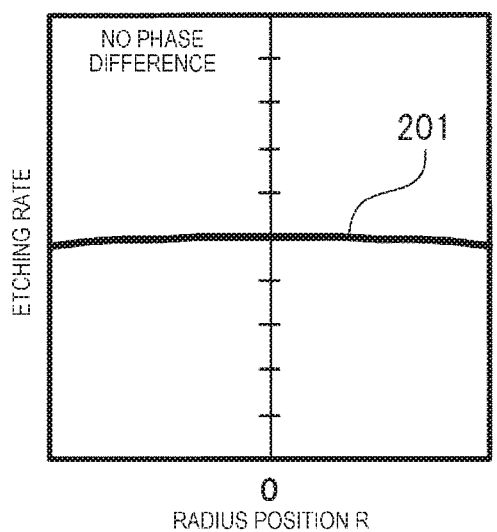
FIGS. 9A and 9B are explanatory diagrams showing examples of an etching rate distribution at the time of applying a radio frequency RF bias according to presence or absence of a phase difference according to studies of the inventors of the present invention.
Figure 9B:
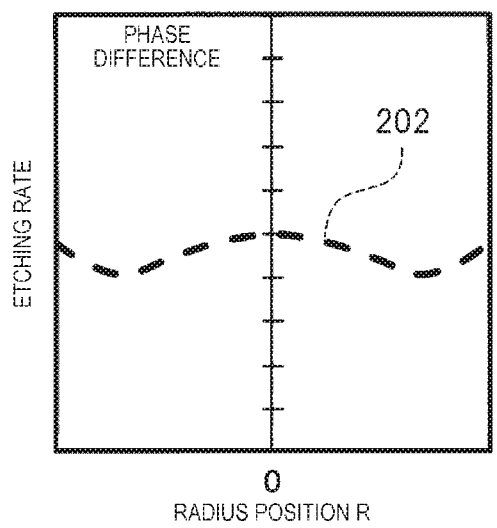
Figure 10A:
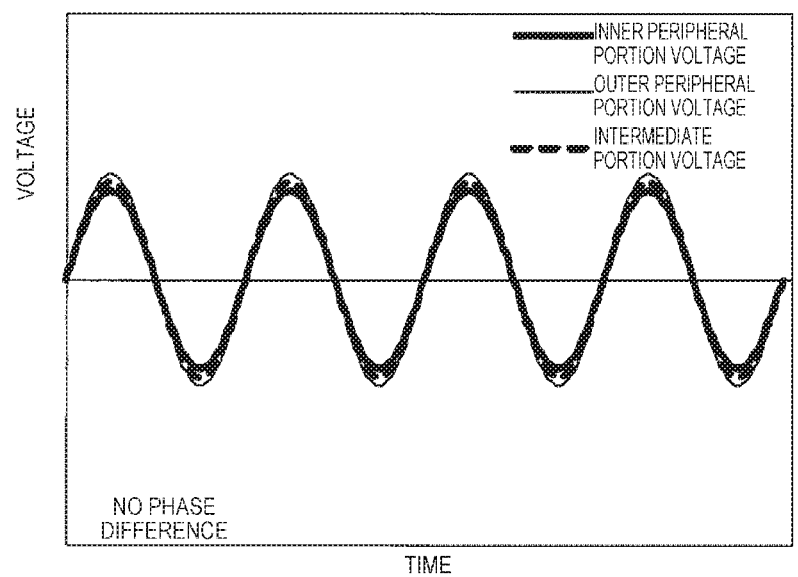
FIGS. 10A and 10B are explanatory diagrams showing examples within a Vpp distribution in a plane of a wafer according to studies of the inventors of the present invention.
Figure 10B:
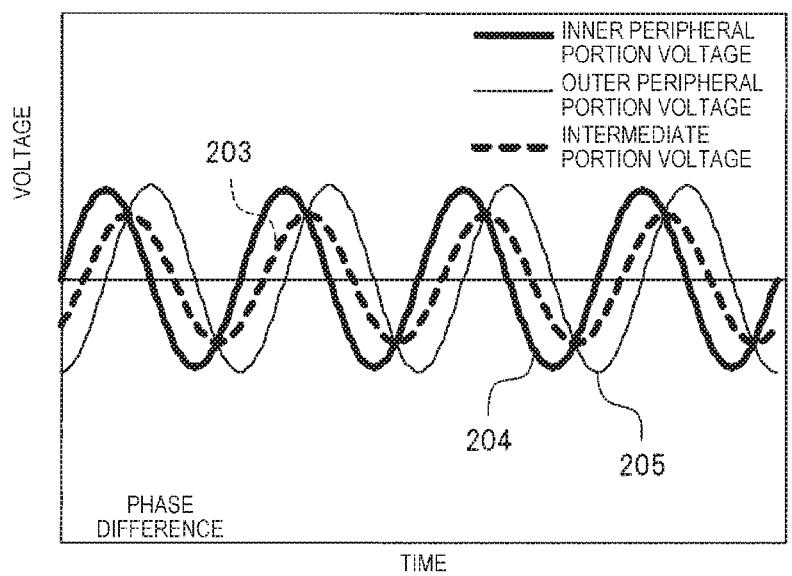

FIGS. 9A and 9B are explanatory diagrams showing examples of an etching rate distribution at the time of applying a radio frequency bias according to the presence or absence of a phase difference according to studies of the inventors of the present invention. FIGS. 10A and 10B are explanatory diagrams showing examples within a Vpp distribution in a plane of a wafer according to studies of the inventors of the present invention.

Even if Vpp of the radio frequency biases applied to the two regions on the wafer surface which is a sample on the electrode, for example, the inner peripheral portion and the outer peripheral portion of the wafer, is the same, there is a phenomenon that the etching rate distribution is different between the case where there is a phase difference between these radio frequency biases and the case where there is no phase difference as indicated by the curve 201 in FIG. 9A and the curve 202 in FIG. 9B.

Here, FIG. 9A shows an example of the etching rate distribution in the case where there is no phase difference between the radio frequency bias applied to the inner peripheral portion of the wafer and the radio frequency bias applied to the outer peripheral portion of the wafer, and FIG. 9B shows an example of the etching rate distribution in the case where there is a phase difference between the radio frequency bias applied to the inner peripheral portion of the wafer and the radio frequency bias applied to the outer peripheral portion of the wafer.

Specifically, the Vpp distribution in the wafer plane is different between the phase difference and no phase difference. FIG. 10A shows the voltages of the inner peripheral portion, the outer peripheral portion, and the intermediate portion of the wafer 110 in a case where there is no phase difference, and FIG. 10B shows the voltages of the inner peripheral portion, the outer peripheral portion, and the intermediate portion of the wafer 110 in a case where there is a phase difference.

The reason that there is a phase difference is because a radio frequency bias voltage at the intermediate portion of the wafer 110 between the inner peripheral portion and the outer peripheral portion to which the radio frequency biases of the wafer 110 are respectively applied, is affected by not only the Vpp between the inner peripheral portion and the outer peripheral portion of the wafer as shown by a curve 203 in FIG. 10B, but also by the phase difference between the inner peripheral portion and the outer peripheral portion of the wafer 110 as indicated by curves 204 and 205.

Figure 11:
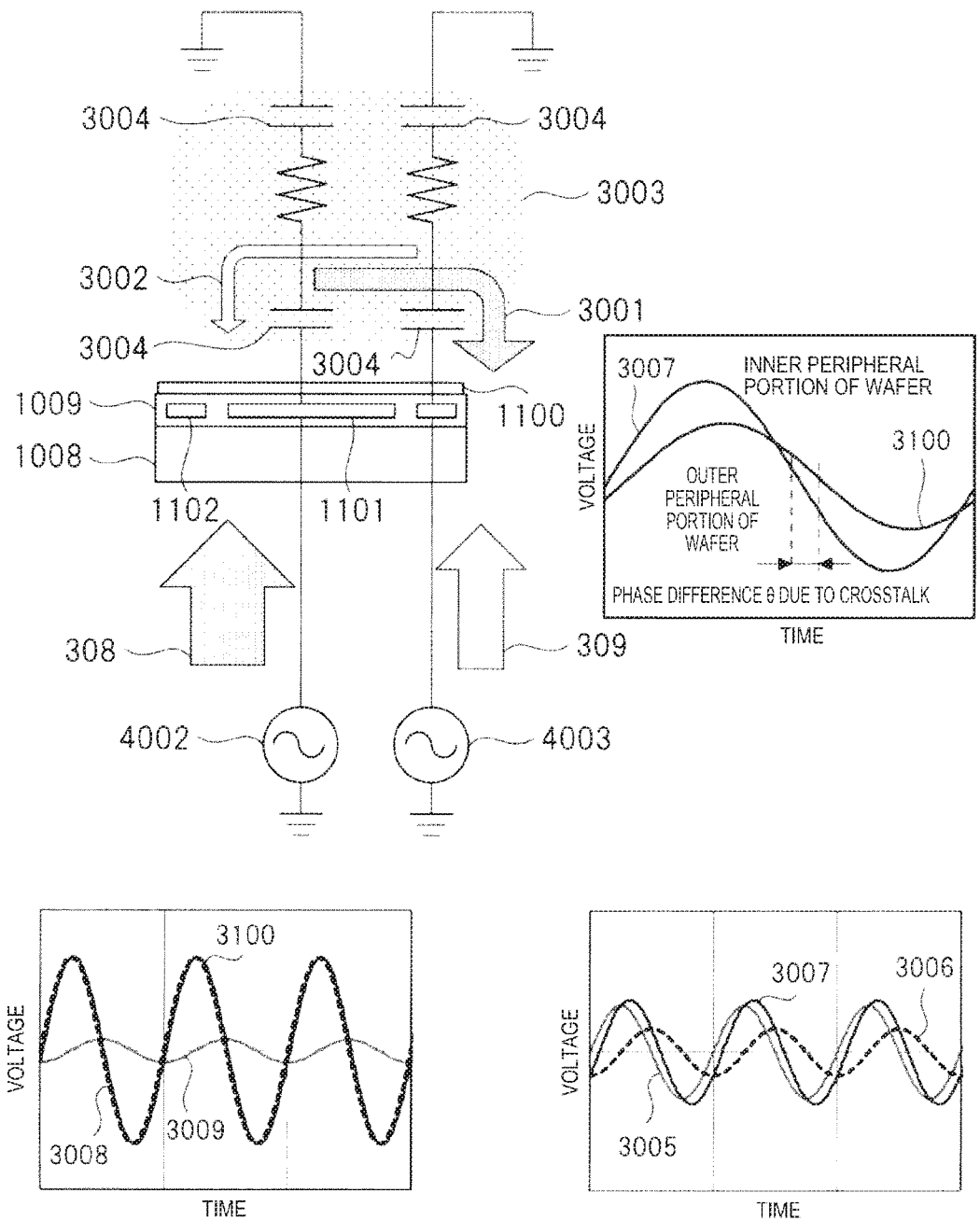
FIG. 11 is an explanatory diagram showing an example of occurrence of a phase difference due to crosstalk according to studies of the inventors of the present invention.

FIG. 11 is an explanatory diagram showing an example of the occurrence of a phase difference due to crosstalk according to studies of the inventors of the present invention.

The cause of the phase difference is crosstalk 3001 as shown in FIG. 11. As described above, crosstalk means that the radio frequency bias applied to one side is propagated to the other transmission path, and as a result, the radio frequency bias propagated to the other side is regarded as a reflected wave for the other side.

The magnitude of this reflected wave is obtained by multiplying the incident wave of the applied radio frequency bias by a proportional coefficient, is represented by the following Equation 1, and varies depending on the setting of the radio frequency biases applied to the inner peripheral portion of the wafer and the outer peripheral portion of the wafer.

"Magnitude of the radio frequency bias applied to one side"×"degree of crosstalk" (Equation 1)

Since the phase of this reflected wave is also propagated through plasma 3003 and a plasma sheath 3004, if the inner peripheral portion of the wafer is taken as an example, as shown in the graph of the incident wave of the radio frequency bias indicated by a curve 3005 in the lower right graph of FIG. 11 and the reflected wave of the radio frequency bias indicated by a curve 3006 in the lower right graph of FIG. 11, the phase of the incident wave of the radio frequency bias differs from the phase of the reflected wave by about 90 degrees.

When the voltage of the transmission path which is the composite wave of the incident wave and the reflected wave, that is, the voltage of the actually applied radio frequency bias is indicated by a curve 3007 in the lower right graph of FIG. 11, which is different from the phase of the original radio frequency bias indicated by the curve 3005. If the radio frequency bias power between the inner peripheral portion and the outer peripheral portion of the wafer 1100 is the same, the power amount of the radio frequency bias being propagated due to the crosstalk is also the same between the inner peripheral portion and the outer peripheral portion of the wafer, and there is no problem because the inner peripheral portion and the outer peripheral portion of the wafer is in phase.

However, in many cases, in order to control the etching rate, the setting of the radio frequency bias between the inner peripheral portion and the outer peripheral portion of the wafer is different, and the radio frequency bias power of the inner peripheral portion of the wafer indicated by an arrow 308 on the upper side of FIG. 11 and the radio frequency bias power of the peripheral portion of the wafer indicated by an arrow 309 are not the same.

The magnitudes of the reflected waves on the inner peripheral portion and the outer peripheral portion of the wafer are respectively indicated by arrows 3001 and 3002 on the upper side of FIG. 11 according to the above-described Equation 1. The voltage graph of the inner peripheral portion of the wafer to be actually applied is as shown on the lower left side of FIG. 11, the voltage graph of the outer peripheral portion of the wafer is as shown on the lower right side of FIG. 11, and the power difference of the radio frequency bias between the inner peripheral portion and the outer peripheral portion of the wafer changes. That is, the phase difference between the inner peripheral portion of the wafer indicated by the curve 307 and the outer peripheral portion of the wafer indicated by the curve 3100 changes each time the combination of the set radio frequency bias power changes.

This is a phase difference caused by crosstalk, and as the crosstalk is suppressed, this phase difference may be reduced.

Figure 12:
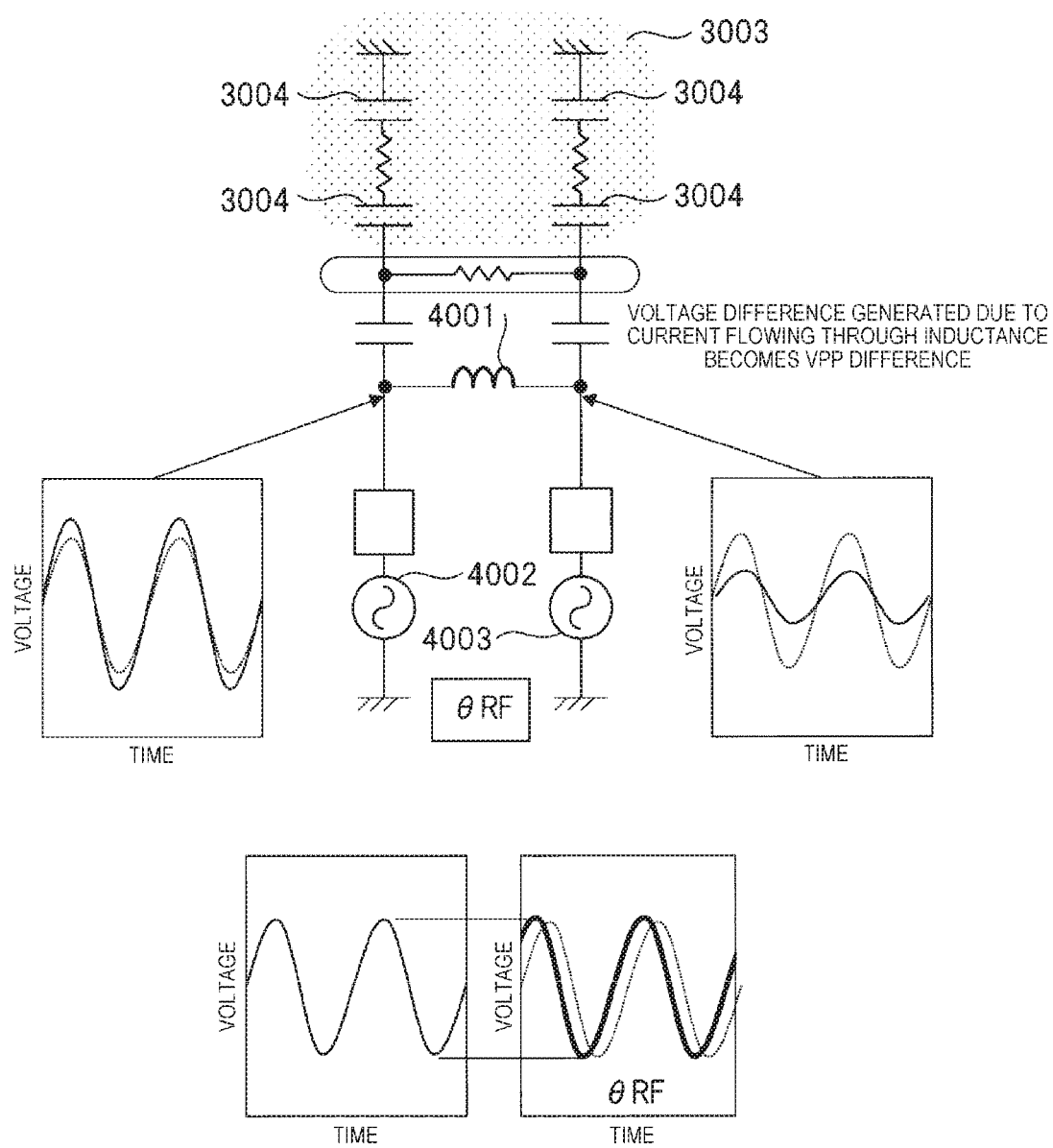
FIG. 12 is an explanatory diagram showing an example of occurrence of a Vpp difference when an inductance for preventing crosstalk is provided according to studies of the inventors of the present invention.

FIG. 12 is an explanatory diagram showing an example of the occurrence of a Vpp difference when an inductance 4001 for preventing crosstalk is provided according to studies of the inventors of the present invention.

In FIG. 12, for the purpose of preventing crosstalk, an example is shown in which the inductance 4001 is provided between the transmission paths to apply a radio frequency bias to the inner peripheral portion and the outer peripheral portion of the wafer.

In a case where the inductance 4001 is provided for the purpose of preventing crosstalk, if there is a phase difference between a radio frequency bias 4002 applied to the inner peripheral portion of the wafer and a radio frequency bias 4003 applied to the peripheral portion of the wafer, a current flows through the inductance 4001. Since this current causes a voltage difference across the inductance 4001, the Vpp difference occurs between the two transmission paths.

Even if the same radio frequency bias is applied to the inner peripheral portion and outer peripheral portion, in a case where there is a phase difference at both ends of the inductance 4001, the Vpp difference occurs between the inner peripheral portion and the outer peripheral portion of the wafer by the phase difference.

FIGS. 13A and 13B are explanatory diagrams showing an example of a change in the etching rate distribution when there is a phase difference and the Vpp difference according to studies of the inventors of the present invention.

As shown in FIG. 13A, in a case where the power supply phase difference θRF is delayed more, Vpp becomes larger, and conversely, in a case where the phase is earlier, Vpp becomes smaller. In addition, as shown in FIG. 13B, the etching rate distribution varies according to the magnitude of Vpp on the inner peripheral portion and the outer peripheral portion of the wafer.

Due to these three factors, in a case where a radio frequency bias is applied to a plurality of regions, an intended etching rate distribution may not be obtained without considering the phase difference of the radio frequency bias in the plane at the time of being applied to the wafer.

In addition, depending on the conditions such as a combination of an individual difference of the radio frequency bias applied by the bias power supply unit, plasma, and radio frequency bias power, it may not be possible to etch with good reproducibility. As a result, there is also a machine-related problem that performance varies from device to device.

On the other hand, according to the plasma processing apparatus 100 of the present embodiment, as described above, it is possible to apply a radio frequency bias to the inner peripheral portion and the outer peripheral portion of the wafer 110 in phase regardless of etching conditions, individual differences of the apparatus or the like by the phase control processing shown in FIG. 7.

Thereby, it is possible to suppress the variation in Vpp and variation in the etching rate distribution due to the phase difference. As a result, it is possible to perform etching with high reproducibility and high uniformity.

Embodiment 2

In Embodiment 2, a technique of eliminating a phase difference factor by applying a radio frequency bias only by either the inner peripheral bias power supply unit 117 or the outer peripheral bias power supply unit 118 will be described.

Application Example of Radio Frequency Bias

FIG. 14 is an explanatory diagram showing an example of the application of a radio frequency bias according to Embodiment 2.

The configuration of the plasma processing apparatus 100 is similar to that of FIG. 1 of Embodiment 1, but as shown by a pulse signal 1101 in FIG. 14, the inner peripheral bias power supply unit 117 and the outer peripheral bias power supply unit 118 included in the plasma processing apparatus 100 may intermittently apply a radio frequency bias, that is, time-modulate.

In addition, the inner peripheral bias power supply unit 117 and the outer peripheral bias power supply unit 118 may randomly adjust the application timing of a radio frequency bias applied to the inner peripheral portion of the wafer 110 and a radio frequency bias applied to the outer peripheral portion of the wafer 110, individually. These kinds of control is performed by the control device 127.

Embodiment 2 is the same as Embodiment 1 Until the inductance 157 of the crosstalk prevention circuit 120 is adjusted so as to minimize crosstalk by applying a radio frequency bias by either the inner peripheral bias power supply unit 117 or the outer peripheral bias power supply unit 118, but thereafter, as shown in voltage waveforms 1102 and 1103 of the signal timing chart in the lower part of FIG. 14, during the processing of the wafer 110, the inner peripheral bias power supply unit 117 and the outer peripheral bias power supply unit 118 alternately apply a radio frequency bias, respectively.

Here, in FIG. 14, the voltage waveform 1102 shows a voltage waveform of the radio frequency bias applied to the inner peripheral electrode 111 by the inner peripheral bias power supply unit 117, and the voltage waveform 1103 shows a voltage waveform of the radio frequency bias applied to the outer peripheral electrode 112 by the outer peripheral bias power supply unit 118.

When a radio frequency bias is applied to only one side as described above, since crosstalk is already minimum, almost no radio frequency bias is applied to the regional side of the wafer 110 to which the other radio frequency bias is not applied, there is almost no phase difference.

In addition, even if there is a phase difference between the radio frequency bias slightly propagated without crosstalk suppression and the applied incident wave, since the phase difference is always constant, the phase difference does not change depending on etching conditions. Therefore, the Vpp difference and the etching rate distribution are constant, and the reproducibility of the etching rate is maintained.

It is possible to adjust the setting of the average magnitude of Vpp for determining the etching rate distribution by an on-duty ratio of the time-modulated bias time or the magnitude of the electric power.

It is impossible to use the setting in a case where it is absolutely necessary to simultaneously apply a plurality of radio frequency biases from the viewpoint of improving the etching shape, but the setting is applicable in other cases.

For example, in the etching processing, it is possible to perform the etching processing of further reducing the influence of the phase difference as compared with Embodiment 1 by increasing the ON time of each radio frequency bias time modulation after adjusting the phase difference at the timing of simultaneously applying the minimum radio frequency bias at the initial instability or the first half of adjustment of the power supply phase difference in Embodiment 1. Thereby, it is possible to improve the reproducibility of the etching rate distribution.

In both of Embodiment 1 and Embodiment 2, an example is shown in which the electrodes of the placement electrode 108 are formed of two electrodes of the inner peripheral electrode 111 and the outer peripheral electrode 112, but the number of electrodes is not limited thereto, and three or more electrodes may be used.

Another Example of Placement Electrode

FIG. 15 is an explanatory diagram showing an example of electrode division in a placement electrode 108 of FIG. 14. FIG. 16 is an explanatory diagram showing another example of the electrode division of FIG. 15.

FIG. 15 shows an example in which the placement electrode 108 is divided into four electrodes. In this case, the placement electrode 108 is configured to have electrodes 111a to 111d. The electrode 111a is formed of a concentric electrode and is provided at the center of the placement electrode 108.

The electrodes 111b to 111d are each formed of a donut-shaped electrode, and the electrode 111b is provided so as to surround the electrode 111a. The electrode 111c is provided so as to surround the electrode 111b. The electrode 111d is provided so as to surround the electrode 111c.

FIG. 16 shows an example in which the placement electrode 108 has five electrodes. In this case, the placement electrode 108 has electrodes 111a to 111e. The electrode 111a is concentric and is provided at the center portion of the placement electrode 108. A washer-shaped electrode is formed by the remaining electrodes 111b to 111e. The washer-shaped electrode formed by these electrodes 111b to 111e is provided so as to surround the electrode 111a.

However, when the placement electrode 108 is divided into two or three, or divided into four electrodes, the number of combinations of the crosstalk suppression and the phase difference control becomes from simply one to three, further to six, and control complexity also increases, and control takes time.

In this case, as shown in FIGS. 15 and 16, respectively, regarding crosstalk suppression, only the adjacent region on the wafer 110 may be controlled, or the power supply phase difference may be set to zero only for the phase difference of the most affected region. For the other region, it is possible to omit the phase of each radio frequency bias by averaging, complementing, or making each radio frequency bias in phase.

As a result, regardless of the number of divisions of the placement electrode 108, it is possible to make the elements of each phase difference of the placement electrode 108 almost zero.

In the placement electrode 108, Vpp is increased in a region having a low etching rate, and conversely, Vpp is decreased in a region having a high etching rate, whereby it is possible to achieve a more accurate etching rate and facilitate the design.

In Embodiments 1 and 2, the material to be etched is, for example, a silicon oxide film, but similar effects may be obtained in a polysilicon film, a photoresist film, an antireflection organic film, a silicon nitride oxide film, a silicon nitride film, a Low-k material, a High-k material, an amorphous carbon film, a Si (silicon) substrate, and the like.

As a gas for performing etching, for example, chlorine, hydrogen bromide, methane tetrafluoride, methane trifluoride, methane difluoride, argon, helium, oxygen, nitrogen, carbon dioxide, carbon monoxide, hydrogen, ammonia, propane octafluoride, nitrogen trifluoride, sulfur hexafluoride, methane, tetrafluoridesilicide, silicon tetrachloride, or the like may be used.

Regarding the discharge method of the etching apparatus, the same effects may be obtained not only in the etching apparatus utilizing the microwave ECR discharge but also in the dry etching apparatus utilizing, but also in, for example, a dry etching apparatus utilizing a magnetic field ultra radio frequency (UHF) discharge, capacitively coupled discharge, inductively coupled discharge, magnetron discharge or the like.

Basically, it is possible to apply the plasma etching apparatus in a process in which a radio frequency bias power supply for pulling ions is provided and the etching rate varies according to Vpp generated by applying the radio frequency bias power supply, that is, to the process having correlation between ion energy and the etching rate.

Although the invention made by the present inventor has been concretely described based on an example, it is needless to say that the present invention is not limited to the examples described above, and various modifications can be made without departing from the gist thereof. For example, the above-described examples have been described in detail in order to explain the present invention in an easy-to-understand manner, and is not necessarily limited to having all the configurations described. In addition, it is possible to add, delete, and replace other configurations for part of the configuration of each example.

What is claimed is:

1. A plasma processing apparatus comprising:
   a vacuum processing chamber in which a sample is subjected to plasma processing;
   a sample stage on which the sample is placed and which comprises a first electrode for electrostatically adsorbing the sample and a second electrode disposed outside the first electrode for electrostatically adsorbing the sample;
   a first radio frequency power supply that supplies a first radio frequency power to the first electrode via a first transmission path;
   a second radio frequency power supply that supplies a second radio frequency power having the same frequency as the frequency of the first radio frequency power to the second electrode via a second transmission path;
   a third radio frequency power supply that supplies a third radio frequency power for generating plasma;
   a crosstalk suppression unit that is disposed between the first transmission path and the second transmission path for suppressing crosstalk that causes one transmission path to affect the other transmission path; and
   a control device configured to control a phase difference between a phase of the first radio frequency power and a phase of the second radio frequency power so that a phase of a radio frequency voltage applied to the first electrode and a phase of a radio frequency voltage applied to the second electrode are approximately equal to each other,
   wherein the crosstalk suppression unit includes an inductance, and
   wherein a value of the inductance is a value obtained based on a minimum value of a value obtained by dividing a potential of the second transmission path by a potential of the first transmission path.

2. A plasma processing apparatus comprising:
   a vacuum processing chamber in which a sample is subjected to plasma processing;
   a sample stage on which the sample is placed and which comprises a first electrode for electrostatically adsorbing the sample and a second electrode disposed outside the first electrode for electrostatically adsorbing the sample;
   a first radio frequency power supply that supplies a first radio frequency power to the first electrode via a first transmission path;
   a second radio frequency power supply that supplies a second radio frequency power having the same frequency as the frequency of the first radio frequency power to the second electrode via a second transmission path;
   a third radio frequency power supply that supplies a third radio frequency power for generating plasma;
   a crosstalk suppression unit that is disposed between the first transmission path and the second transmission path for suppressing crosstalk that causes one transmission path to affect the other transmission path; and
   a control device configured to control a phase difference between a phase of the first radio frequency power and a phase of the second radio frequency power based on a minimum value of a current flowing through the crosstalk suppression unit,
   wherein the crosstalk suppression unit includes an inductance, and
   wherein a value of the inductance is a value obtained based on a minimum value of a value obtained by dividing a potential of the second transmission path by a potential of the first transmission path.

3. A plasma processing method using a plasma processing apparatus,
   wherein the plasma processing apparatus includes
      a vacuum processing chamber in which a sample is subjected to plasma processing,
      a sample stage on which the sample is placed and which has a first electrode for electrostatically adsorbing the sample and a second electrode disposed outside the first electrode for electrostatically adsorbing the sample,
      a first radio frequency power supply that supplies a first radio frequency power to the first electrode via a first transmission path,
      a second radio frequency power supply that supplies a second radio frequency power having the same frequency as the frequency of the first radio frequency power to the second electrode via a second transmission path, and
      a third radio frequency power supply that supplies a third radio frequency power for generating plasma,
   the plasma processing method comprising:
      a step of controlling a phase difference between a phase of the first radio frequency power and a phase of the second radio frequency power so that a phase of a radio frequency voltage applied to the first electrode and a phase of a radio frequency voltage applied to the second electrode are approximately equal to each other; and
      a step of suppressing crosstalk that causes one of the first or second transmission paths to affect the other of the first or second transmission paths, based on a minimum value of a value obtained by dividing a potential of the second transmission path by a potential of the first transmission path.

4. A plasma processing method using a plasma processing apparatus, wherein the plasma processing apparatus comprises a vacuum processing chamber in which a sample is subjected to plasma processing, a sample stage on which the sample is placed and which comprises a first electrode for electrostatically adsorbing the sample and a second electrode disposed outside the first electrode for electrostatically adsorbing the sample, a first radio frequency power supply that supplies a first radio frequency power to the first electrode via a first transmission path, a second radio frequency power supply that supplies a second radio frequency power having the same frequency as the frequency of the first radio frequency power to the second electrode via a second transmission path, a third radio frequency power supply that supplies a third radio frequency power for generating plasma, and a crosstalk suppression unit that is disposed between the first transmission path and the second transmission path for suppressing crosstalk that causes one transmission path to affect the other transmission path, the plasma processing method comprising:

a step of controlling a phase difference between a phase of the first radio frequency power and a phase of the second radio frequency power based on a minimum value of a current flowing through the crosstalk suppression unit; and a step of suppressing crosstalk between the first transmission path and the second transmission path based on a minimum value of a value obtained by dividing a potential of the second transmission path by a potential of the first transmission path.

* * * * *